United States Patent
Saiki et al.

(10) Patent No.: US 11,047,915 B2
(45) Date of Patent: Jun. 29, 2021

(54) POWER ESTIMATING APPARATUS, IMAGE FORMING APPARATUS, AND NON-TRANSITORY COMPUTER READABLE MEDIUM

(71) Applicant: FUJIFILM Business Innovation Corp., Tokyo (JP)

(72) Inventors: Takaki Saiki, Kanagawa (JP); Seiji Honda, Kanagawa (JP); Tomokazu Akuta, Kanagawa (JP); Yoshiro Konishi, Kanagawa (JP); Kenichi Ito, Kanagawa (JP)

(73) Assignee: FUJIFILM Business Innovation Corp., Tokyo (JP)

( * ) Notice: Subject to any disclaimer, the term of this patent is extended or adjusted under 35 U.S.C. 154(b) by 1033 days.

(21) Appl. No.: 15/594,736

(22) Filed: May 15, 2017

(65) Prior Publication Data

US 2018/0080998 A1  Mar. 22, 2018

(30) Foreign Application Priority Data

Sep. 21, 2016 (JP) .............................. JP2016-184425

(51) Int. Cl.
*G01R 31/36* (2020.01)
*G03G 15/20* (2006.01)
(Continued)

(52) U.S. Cl.
CPC ... *G01R 31/3646* (2019.01); *G01R 19/16547* (2013.01); *G01R 21/133* (2013.01);
(Continued)

(58) Field of Classification Search
CPC ................................................ G01R 31/3682
See application file for complete search history.

(56) References Cited

U.S. PATENT DOCUMENTS 4,674,605 A * 6/1987 McPherson ........... B66B 1/3484
187/392
5,764,496 A * 6/1998 Sato ...................... H02M 1/425
363/124

(Continued)

FOREIGN PATENT DOCUMENTS

JP 2010-181633 A 8/2010
JP 2016025827 A 2/2016

OTHER PUBLICATIONS

Communication dated Nov. 4, 2020, from the Japanese Patent Office in Application No. 2016-249516.

*Primary Examiner* — Manuel A Rivera Vargas
*Assistant Examiner* — Yaritza H Perez Bermudez
(74) *Attorney, Agent, or Firm* — Sughrue Mion, PLLC

(57) ABSTRACT

A power estimating apparatus includes a functional unit, at least one converter, a detection unit, and an estimating unit. The functional unit uses an alternating-current power supply. The at least one converter is connected to a branch point between the alternating-current power supply and the functional unit and includes a smoothing capacitor so as to convert an alternating current from the alternating-current power supply into a direct current. The detection unit obtains a total amount of currents supplied to the functional unit and the at least one converter. The estimating unit uses the total amount to estimate an amount of the current supplied to the functional unit. The total amount is obtained by the detection unit in a charge and discharge period during which the smoothing capacitor performs a charge and discharge operation.

16 Claims, 6 Drawing Sheets

(51) Int. Cl.
*G01R 21/133* (2006.01)
*G01R 19/165* (2006.01)
*G03G 15/00* (2006.01)

(52) U.S. Cl.
CPC ..... *G01R 31/3648* (2013.01); *G03G 15/2039* (2013.01); *G03G 15/5004* (2013.01)

(56) References Cited

U.S. PATENT DOCUMENTS

| | | | |
|---|---|---|---|
| 9,066,373 B2* | 6/2015 | Kulp, Jr. | H05B 6/062 |
| 2010/0196038 A1* | 8/2010 | Yamaguchi | G03G 15/2039 |
| | | | 399/69 |
| 2011/0148202 A1* | 6/2011 | Rada | G05F 1/70 |
| | | | 307/52 |
| 2012/0285948 A1* | 11/2012 | Shan | H05B 6/062 |
| | | | 219/660 |
| 2013/0111237 A1* | 5/2013 | Inukai | G03G 15/80 |
| | | | 713/320 |
| 2013/0257406 A1* | 10/2013 | Hausman, Jr. | G05F 5/00 |
| | | | 323/300 |
| 2014/0126261 A1* | 5/2014 | Newman, Jr. | H02M 5/293 |
| | | | 363/128 |
| 2014/0186066 A1* | 7/2014 | Inukai | H02M 7/217 |
| | | | 399/88 |
| 2014/0265880 A1* | 9/2014 | Taipale | H05B 45/10 |
| | | | 315/158 |
| 2016/0371572 A1* | 12/2016 | Saiki | H02H 9/001 |
| 2017/0149369 A1* | 5/2017 | Watabu | H02J 7/007 |
| 2017/0349400 A1* | 12/2017 | Bitzi | B66B 5/0018 |
| 2018/0080998 A1* | 3/2018 | Saiki | G01R 21/133 |
| 2020/0150573 A1* | 5/2020 | Izaki | G03G 15/5004 |
| 2020/0204057 A1* | 6/2020 | Kato | H02M 1/12 |

* cited by examiner

FIG. 5

| DETECTION OF ZERO CROSS | CURRENT DETECTION VALUE | | |
|---|---|---|---|
| Td { t1 | i1 | } DETECTION OF FIXING-DEVICE CURRENT | } DETECTION OF APPARATUS CURRENT |
| t2 | i2 | | |
| t3 | i3 | | |
| t4 | i4 | | |
| t5 | i5 | | |
| t6 | i6 | | |
| t7 | i7 | | |
| t8 | i8 | | |
| t9 | i9 | | |
| t10 | i10 | | |
| DETECTION OF ZERO CROSS | | | |
| t11 | i11 | | |
| t12 | i12 | | |
| t13 | i13 | | |
| t14 | i14 | | |
| t15 | i15 | | |
| t16 | i16 | | |
| t17 | i17 | | |
| t18 | i18 | | |
| t19 | i19 | | |
| t20 | i20 | | |
| DETECTION OF ZERO CROSS | | | |

POWER ESTIMATING APPARATUS, IMAGE FORMING APPARATUS, AND NON-TRANSITORY COMPUTER READABLE MEDIUM

CROSS-REFERENCE TO RELATED APPLICATIONS

This application is based on and claims priority under 35 USC 119 from Japanese Patent Application No. 2016-184425 filed Sep. 21, 2016.

BACKGROUND

Technical Field

The present invention relates to a power estimating apparatus, an image forming apparatus, and a non-transitory computer readable medium.

SUMMARY

According to an aspect of the invention, there is provided a power estimating apparatus including a functional unit, at least one converter, a detection unit, and an estimating unit. The functional unit uses an alternating-current power supply. The at least one converter is connected to a branch point between the alternating-current power supply and the functional unit and includes a smoothing capacitor so as to convert an alternating current from the alternating-current power supply into a direct current. The detection unit obtains a total amount of currents supplied to the functional unit and the at least one converter. The estimating unit uses the total amount to estimate an amount of the current supplied to the functional unit. The total amount is obtained by the detection unit in a charge and discharge period during which the smoothing capacitor performs a charge and discharge operation.

BRIEF DESCRIPTION OF THE DRAWINGS

Exemplary embodiments of the present invention will be described in detail based on the following figures, wherein:

FIG. 5 is a diagram for describing a method of detecting a fixing-device current and an apparatus current from detection times and detected current values.

DETAILED DESCRIPTION

Figure 1:
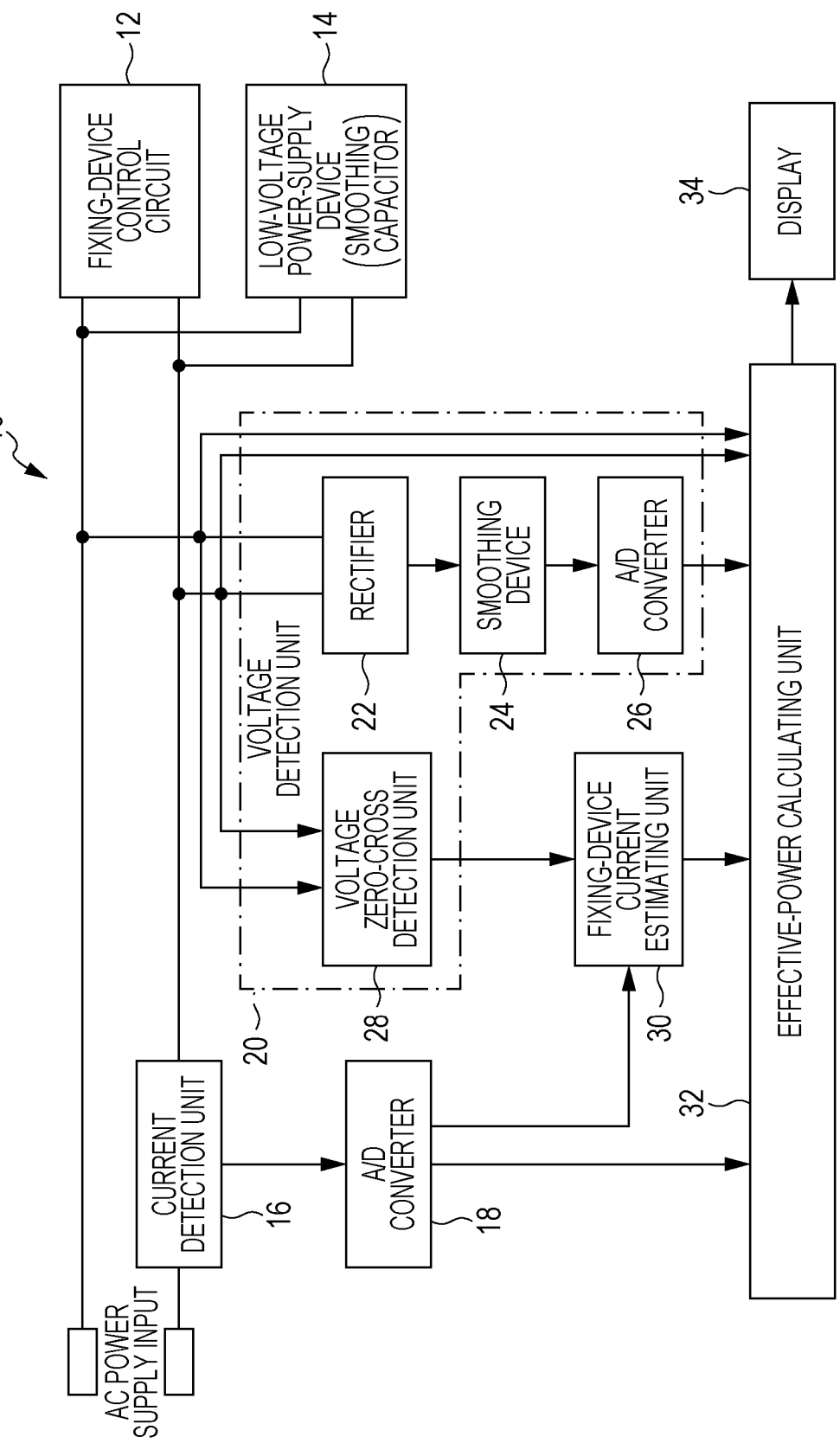
FIG. 1 is a diagram illustrating the configuration of a power supply portion of an image forming apparatus including a power estimating apparatus according to an exemplary embodiment.

An exemplary embodiment of the present invention will be described below in detail with reference to the drawings. FIG. 1 is a diagram illustrating a schematic configuration of a power supply portion of an image forming apparatus 10 including a power estimating apparatus according to the exemplary embodiment.

The image forming apparatus 10 includes a fixing-device control circuit 12 supplying alternating-current power to a fixing device, and a low-voltage power-supply device 14 supplying direct-current power to units of the image forming apparatus 10. Alternating-current power supplies (denoted as AC power supplies in FIG. 1) supply power to each of the fixing-device control circuit 12 and the low-voltage power-supply device 14.

The fixing-device control circuit 12 corresponds to an exemplary functional unit, and uses supplied alternating-current power supplies to drive the fixing device of the image forming apparatus 10.

The low-voltage power-supply device 14 corresponds to an exemplary converter. The low-voltage power-supply device 14 including a smoothing capacitor is connected to a branch point between a supplied alternating-current power supply and the fixing-device control circuit 12, and converts an alternating-current power supply into a direct-current power supply. The low-voltage power-supply device 14 supplies the units of the image forming apparatus 10 with power of the direct-current power supply obtained through the conversion. For example, the low-voltage power-supply device 14 obtains a direct-current voltage 5 (V) through conversion, and supplies the power to a board, a sensor, and the like. The low-voltage power-supply device 14 also obtains a direct-current voltage 24 (V) through conversion, and supplies the power to a motor, a fan, and the like.

The image forming apparatus 10 further includes a current detection unit 16, a voltage detection unit 20, a fixing-device current estimating unit 30, an effective-power calculating unit 32, and a display 34. The fixing-device current estimating unit 30 corresponds to an exemplary estimating unit and an exemplary specifying unit.

The current detection unit 16 is disposed between an alternating-current power supply and the fixing-device control circuit 12. The voltage detection unit 20 is connected to a branch point between the alternating-current power supply and the fixing-device control circuit 12.

The current detection unit 16 corresponds to an exemplary detection unit. For example, the current detection unit 16 which includes a resistor, a Hall device, or the like detects an instantaneous current waveform used to obtain current values of the alternating-current power supply, and outputs the detection result to an analog/digital (A/D) converter 18. The A/D converter 18 converts the detected analog instantaneous current waveform into a digital signal, and outputs, to the effective-power calculating unit 32, the digital signal as current values of the alternating-current power supply.

The voltage detection unit 20 includes a rectifier 22, a smoothing device 24, an A/D converter 26, and a voltage zero-cross detection unit 28 corresponding to an exemplary voltage zero-cross detection unit.

The rectifier 22 rectifies the instantaneous voltage waveform of the alternating-current power supplies so as to convert the alternating current to a direct current and output the direct current to the smoothing device 24.

The smoothing device 24 including a smoothing capacitor smooths the instantaneous voltage waveform rectified by the rectifier 22, and outputs, to the A/D converter 26, an effective voltage waveform obtained through smoothing.

The A/D converter 26 converts the analog effective voltage waveform into a digital signal, and outputs the digital signal to the effective-power calculating unit 32.

The voltage zero-cross detection unit 28 detects a zero cross at which the polarity of the voltage of the instantaneous voltage waveform supplied from the alternating-current power supplies is reversed. The voltage zero-cross detection unit 28 notifies the fixing-device current estimating unit 30 of detection of a zero cross.

Based on the result of detection of a zero cross, the fixing-device current estimating unit 30 estimates the amount of a current consumed by the fixing-device control circuit 12, on the basis of values of a current detected by the current detection unit 16 during a predetermined period Td (see FIG. 2) starting from a time point at which a zero cross is detected. The fixing-device current estimating unit 30 outputs the estimation result to the effective-power calculating unit 32.

The effective-power calculating unit 32 calculates the effective power for the entire apparatus, the power consumption of the fixing-device control circuit 12, and the power consumption of the low-voltage power-supply device 14 on the basis of the detection result obtained by the current detection unit 16, the estimation result obtained by the fixing-device current estimating unit 30, and the instantaneous voltage waveform. The effective-power calculating unit 32 displays the calculated powers on the display 34. The fixing-device current estimating unit 30 and the effective-power calculating unit 32 correspond to an exemplary estimating unit.

The power supplied from the alternating-current power supplies is supplied to the fixing-device control circuit 12 and the low-voltage power-supply device 14. To detect a current supplied to each of the fixing-device control circuit 12 and the low-voltage power-supply device 14, a current detection unit 16 needs to be provided for each of the fixing-device control circuit 12 and the low-voltage power-supply device 14. However, this leads to not only an increase in cost but also inhibition of reduction in the size of the apparatus.

Therefore, in the exemplary embodiment, the fixing-device current estimating unit 30 estimates the amount of a current supplied to the fixing-device control circuit 12, so as to determine the amount of a current supplied to each of the fixing-device control circuit 12 and the low-voltage power-supply device 14 by using a single current detection unit 16.

A method of estimating the fixing-device current which is a current supplied to the fixing-device control circuit 12, by using the fixing-device current estimating unit 30 will be described. The fixing-device current needs to be estimated to determine the amount of a current supplied to each of the fixing-device control circuit 12 and the low-voltage power-supply device 14.

Figure 2:
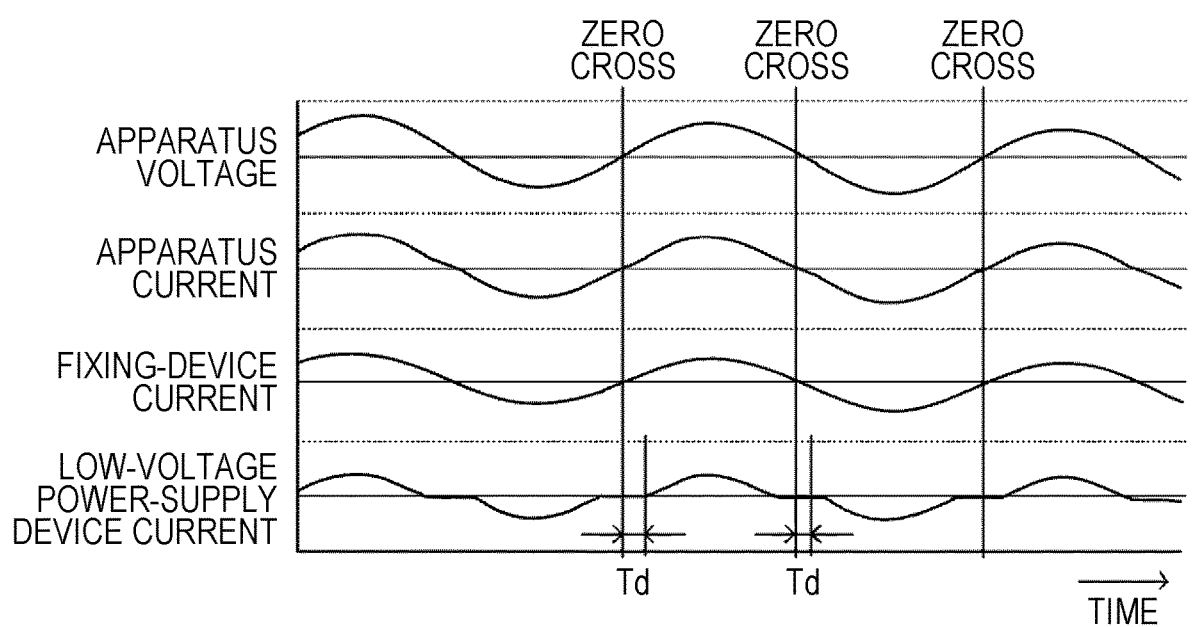
FIG. 2 is a waveform diagram illustrating exemplary waveforms of an apparatus voltage which has an instantaneous voltage waveform of alternating-current power supplies and which is supplied to the entire apparatus, an apparatus current supplied to the entire apparatus, a fixing-device current supplied to a fixing-device control circuit, and a low-voltage power-supply device current supplied to a low-voltage power-supply device.
Figure 3:
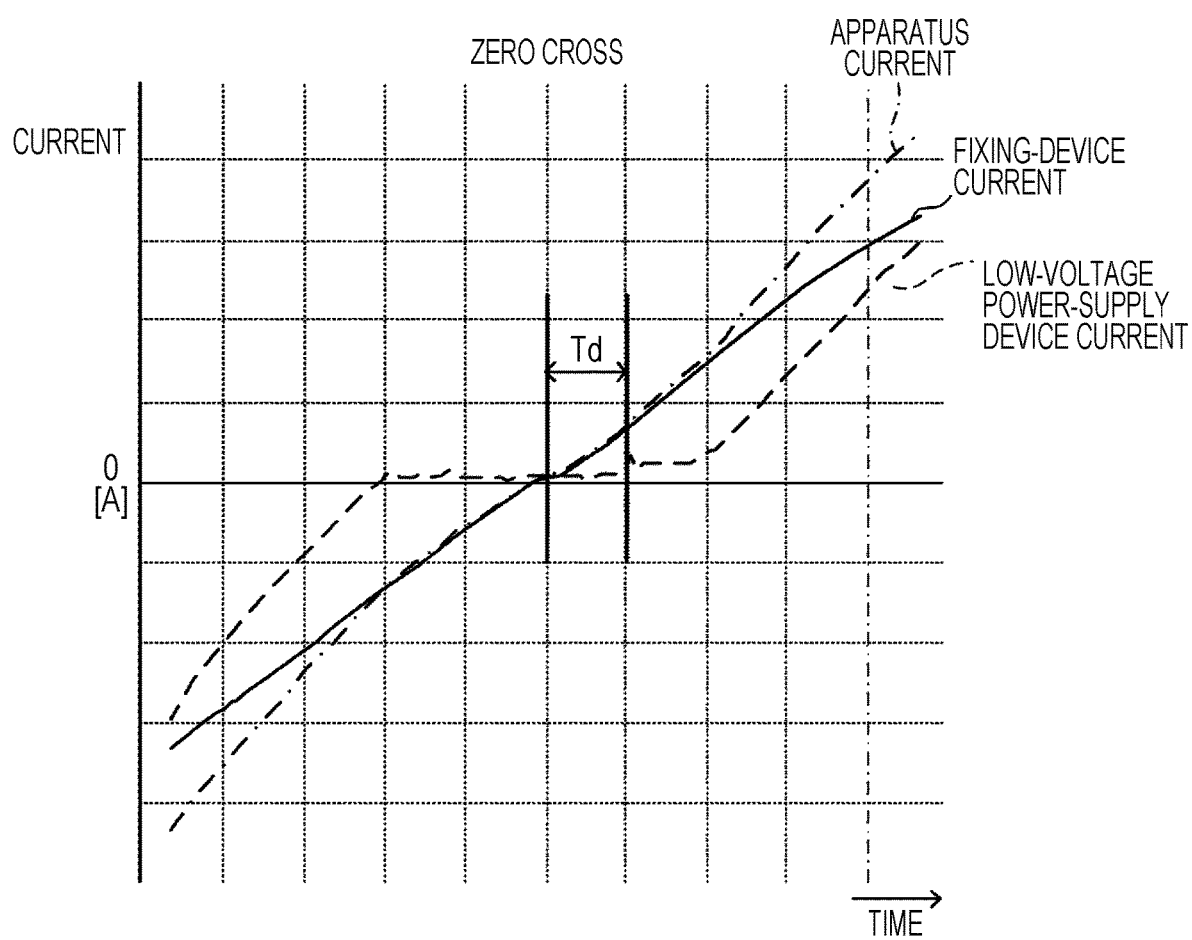
FIG. 3 is a diagram illustrating enlarged examples of the apparatus current, the fixing-device current, and the low-voltage power-supply device current in a zero-cross portion of the apparatus voltage.

FIG. 2 illustrates exemplary waveforms of an apparatus voltage which has an instantaneous voltage waveform of the alternating-current power supplies and which is supplied to the entire apparatus, an apparatus current supplied to the entire apparatus, a fixing-device current supplied to the fixing-device control circuit 12, and a low-voltage power-supply device current supplied to the low-voltage power-supply device 14. FIG. 3 is a diagram illustrating enlarged examples of the apparatus current, the fixing-device current, and the low-voltage power-supply device current in a zero-cross portion of the apparatus voltage.

In the exemplary embodiment, the amount of the fixing-device current is estimated by utilizing the state in which the current of the low-voltage power-supply device 14 (low-voltage power-supply device current in FIG. 3) does not rise even when the apparatus voltage rises or falls after the apparatus voltage passes through a zero cross. That is, since the low-voltage power-supply device 14 includes the smoothing capacitor, as illustrated in FIGS. 2 and 3, a rising edge of the low-voltage power-supply device current is delayed due to a timing of the charge and discharge of the smoothing capacitor. Therefore, the predetermined period Td from start of a rising edge of the apparatus voltage after passing through a zero cross till a rising edge of the current caused by the charge and discharge of the smoothing capacitor is set. The period Td is determined in accordance with the circuit configuration including the smoothing capacitor. During the determined period Td, a current detected by the current detection unit 16 does not flow to the low-voltage power-supply device 14, and is supplied to the fixing-device control circuit 12. A current supplied to the fixing-device control circuit 12 after a lapse of the period Td has the same inclination as the inclination during the period Td. Therefore, the detection result from the current detection unit 16 during the period Td is used to determine the amount of a fixing-device current supplied to the fixing-device control circuit 12. Thus, the detection result from the current detection unit 16 during the period Td is used to estimate the amount of a fixing-device current supplied to the fixing-device control circuit 12.

In the exemplary embodiment, the effective-power calculating unit 32 calculates the amount of the apparatus current supplied to the entire apparatus from detection values obtained by the current detection unit 16 for one cycle of the apparatus voltage. By subtracting the amount of the fixing-device current which is estimated by the fixing-device current estimating unit 30, from the calculated amount of the apparatus current, the amount of a current supplied to the low-voltage power-supply device 14 is determined. In the exemplary embodiment, the example using detection values obtained for one cycle of the apparatus voltage is described. The amount of the apparatus current supplied to the entire apparatus may be calculated on the basis of detection values obtained for a half cycle.

Thus, the effective-power calculating unit 32 calculates the effective power of the entire apparatus from the detection result obtained from the current detection unit 16 and the detection result obtained from the voltage detection unit 20. The amount of the fixing-device current supplied to the fixing-device control circuit 12 and the amount of a current supplied to the low-voltage power-supply device 14 are determined. Therefore, the effective-power calculating unit 32 may also calculate the power consumption of the fixing-device control circuit 12 and the power consumption of the low-voltage power-supply device 14.

Figure 4:
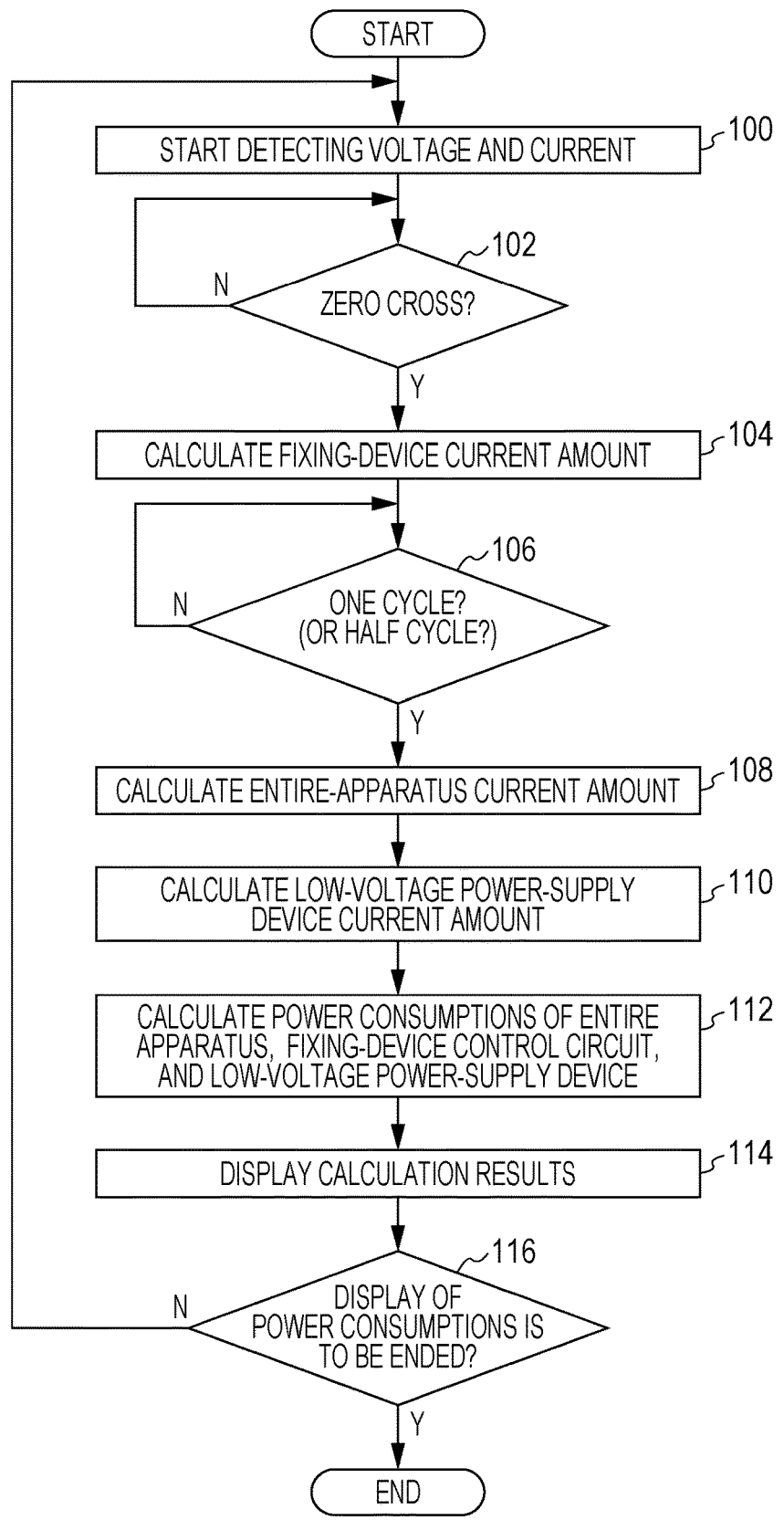
FIG. 4 is a flowchart of an exemplary process flow performed by the units of the image forming apparatus according to the exemplary embodiment.

Specific processes performed by the units of the image forming apparatus 10 having the above-described configuration will be described. FIG. 4 is a flowchart of an exemplary process flow performed by the units of the image forming apparatus 10 according to the exemplary embodiment. For example, the process in FIG. 4 starts when an instruction or the like to display the power consumption of the image forming apparatus 10 is given.

In step 100, the voltage detection unit 20 starts detecting a voltage, and the current detection unit 16 starts detecting a current. Then, the process proceeds to step 102. That is, the instantaneous voltage waveform of the alternating-current power supplies is rectified by the rectifier 22, and is smoothed by the smoothing device 24. Then, the A/D converter 26 converts the resulting voltage into a digital signal. The A/D converter 18 converts the instantaneous current waveform detected by the current detection unit 16 into a digital signal. For example, as illustrated in FIG. 5, the current detection unit 16 obtains the detection values of a current detected at certain time intervals.

In step 102, the voltage zero-cross detection unit 28 determines whether or not a zero cross of the instantaneous voltage waveform has been detected. The voltage zero-cross detection unit 28 waits until the determination result is positive, and the process proceeds to step 104.

In step 104, the fixing-device current estimating unit 30 uses values of a current detected during the predetermined period Td, so as to calculate the amount of the fixing-device current, and the process proceeds to step 106. For example, as illustrated in FIG. 5, when the period Td is a time from t1 to t5, the inclination of the fixing-device current in the voltage zero-cross portion which is illustrated in FIG. 3 is calculated on the basis of the current detection values i1 to i5 at times t1 to t5 so that the amount of the fixing-device current is calculated.

In step 106, the voltage zero-cross detection unit 28 determines whether or not one cycle (or a half cycle) of voltage supplied from the alternating-current power supplies has been completed. The voltage zero-cross detection unit 28 waits until the determination result is positive, and the process proceeds to step 108.

In step 108, the fixing-device current estimating unit 30 uses the current values obtained during a period corresponding to one cycle of voltage supplied from the alternating-current power supplies, so as to calculate the amount of a current supplied to the entire apparatus. Then, the process proceeds to step 110.

In step 110, the effective-power calculating unit 32 calculates the amount of a current supplied to the low-voltage power-supply device 14, and the process proceeds to step 112. That is, the amount of the fixing-device current which is calculated in step 104 is subtracted from the amount of a current of the entire apparatus which is calculated in step 108. In this manner, the amount of a current supplied to the low-voltage power-supply device 14 is calculated.

In step 112, the effective-power calculating unit 32 calculates the power consumption of the entire apparatus, the power consumption of the fixing-device control circuit 12, and the power consumption of the low-voltage power-supply device 14, and the process proceeds to step 114. That is, the effective-power calculating unit 32 calculates the effective power of the entire apparatus from the detection result from the current detection unit 16 and the detection result from the voltage detection unit 20. Since the amount of the fixing-device current supplied to the fixing-device control circuit 12 and the amount of a current supplied to the low-voltage power-supply device 14 have been calculated, the effective-power calculating unit 32 calculates the power consumption of the fixing-device control circuit 12 and the power consumption of the low-voltage power-supply device 14.

In step 114, the effective-power calculating unit 32 displays the calculation results obtained in steps 108, 110, and 112 on the display 34, and the process proceeds to step 116. That is, the amounts of currents supplied to the entire apparatus, the fixing-device control circuit 12, and the low-voltage power-supply device 14, and the power consumptions are displayed on the display 34.

In step 116, the effective-power calculating unit 32 determines whether or not the display of the power consumptions and the like on the display 34 is to be ended. For example, the effective-power calculating unit 32 determines whether or not an instruction to end the display of power consumptions and the like of the image forming apparatus 10 has been given. If the determination result is negative, the process returns back to step 100, and the above-described processes are repeatedly performed. If the determination result is positive, the series of processes are ended.

In the above-described exemplary embodiment, as illustrated in FIG. 1, the configuration in which the voltage detection unit 20 is provided separately from the low-voltage power-supply device 14 is described. However, this is not limiting. The low-voltage power-supply device 14 has a configuration similar to the configuration of the voltage detection unit 20. Therefore, a voltage detection unit in the low-voltage power-supply device 14 may be used.

Figure 6:
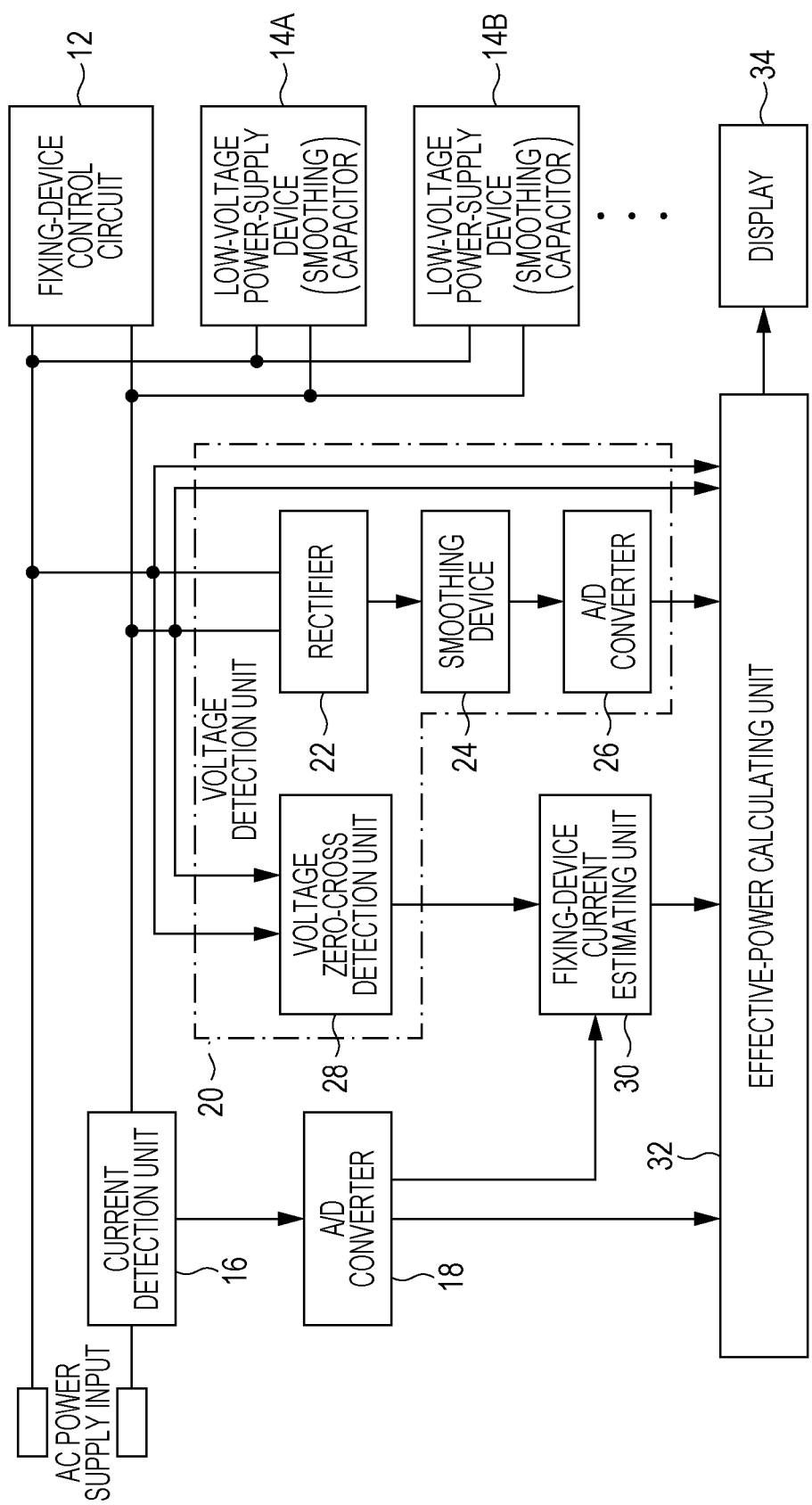
FIG. 6 is a block diagram illustrating the configuration of a power supply portion of an image forming apparatus including a power estimating apparatus according to a modified example of the exemplary embodiment.

In the above-described exemplary embodiment, the example in which only one low-voltage power-supply device 14 is provided for the image forming apparatus 10 is described. The number of low-voltage power-supply devices 14 is not limited to one. For example, as illustrated in FIG. 6, multiple low-voltage power-supply devices 14A, 14B, etc. may be provided. In this case, it is not possible to calculate the current amount and power consumption of each of the low-voltage power-supply devices 14A, 14B, etc. Therefore, the current amount and power consumption of all of the low-voltage power-supply devices 14A, 14B, etc. are calculated and displayed. In estimation of the amount of a fixing-device current supplied to the fixing-device control circuit 12, values of a current detected by the current detection unit 16 in an overlapped charge and discharge period for all of the smoothing capacitors of the low-voltage power-supply devices 14A, 14B, etc. are used to estimate the amount of the fixing-device current. That is, the period Td in which all of the smoothing capacitors of the low-voltage power-supply devices 14A, 14B, etc. perform a charge and discharge operation is set. The current detection unit 16 performs detection in the period Td so that the fixing-device current amount is determined.

In the above-described exemplary embodiments, a predetermined period after detection of a zero cross of voltage is used as the period Td. This is not limiting. For example, a predetermined period before detection of a zero cross of voltage may be used, or a predetermined period before and after detection of a zero cross of voltage may be used.

The processes performed by the units of the image forming apparatus 10 according to the above-described exemplary embodiments may be performed by using software, hardware, or a combination of software and hardware. The processes performed by the units of the image forming apparatus 10 may be provided as programs by storing the programs in a storage medium for distribution.

The present invention is not limited to the above-described exemplary embodiments. As a matter of course, other than the above-described exemplary embodiments, various modifications may be made without departing from the gist of the present invention and modified exemplary embodiments may be carried out.

What is claimed is:

1. A power estimating apparatus comprising:
   a control circuit configured to use an alternating-current power supply;
   at least one converter that is connected to a branch point between the alternating-current power supply and the control circuit, wherein the at least one converter includes a smoothing capacitor, and wherein the at least one converter is configured to convert an alternating current from the alternating-current power supply into a direct current;

a detector configured to obtain a total amount of currents supplied to the control circuit and the at least one converter; and at least one processor configured to implement an estimating unit configured to use the obtained total amount of currents to estimate an amount of the current supplied to the control circuit, the total amount of currents being obtained by the detector in a charge and discharge period during which the smoothing capacitor performs a charge and discharge operation.

2. The power estimating apparatus according to claim 1, further comprising:

a voltage zero-cross detector configured to detect a zero cross of voltage supplied from the alternating-current power supply, and wherein the at least one processor is configured to implement a specifying unit that specifies, as the charge and discharge period, at least one of a predetermined period before the zero cross and a predetermined period after the zero cross, the zero cross being detected by the voltage zero-cross detector.

3. The power estimating apparatus according to claim 2, wherein the estimating unit is further configured to estimate an amount of the current supplied to the at least one converter to be equal to an amount obtained by subtracting an amount of the current supplied to the control circuit from the total amount of currents for a half current cycle or the total amount of currents for one current cycle, the half current cycle corresponding to a section of a pulse in which one zero cross of voltage supplied from the alternating-current power supply is detected, the one current cycle corresponding to a section of a pulse in which two zero crosses of the voltage are detected.

4. The power estimating apparatus according to claim 2, wherein the at least one converter comprises a plurality of converters, and wherein the estimating unit is configured to use the total amount of currents obtained by the detector in an overlapped charge and discharge period for smoothing capacitors of the plurality of converters so as to estimate the amount of the current supplied to the control circuit.

5. The power estimating apparatus according to claim 3, wherein the at least one converter comprises a plurality of converters, and wherein the estimating unit is configured to use the total amount of currents obtained by the detector in an overlapped charge and discharge period for smoothing capacitors of the plurality of converters so as to estimate the amount of the current supplied to the control circuit.

6. The power estimating apparatus according to claim 1, wherein the estimating unit is further configured to estimate an amount of the current supplied to the at least one converter to be equal to an amount obtained by subtracting the estimated amount of the current supplied to the control circuit from the total amount of currents for a half current cycle or the total amount of currents for one current cycle, the half current cycle corresponding to a section of a pulse in which one zero cross of voltage supplied from the alternating-current power supply is detected, the one current cycle corresponding to a section of a pulse in which two zero crosses of the voltage are detected.

7. The power estimating apparatus according to claim 6, wherein the at least one converter comprises a plurality of converters, and wherein the estimating unit is configured to use the total amount of currents obtained by the detector in an overlapped charge and discharge period for smoothing capacitors of the plurality of converters so as to estimate the amount of the current supplied to the control circuit.

8. The power estimating apparatus according to claim 1, wherein the at least one converter includes a plurality of converters, and wherein the estimating unit is configured to use the total amount of currents obtained by the detector in an overlapped charge and discharge period for smoothing capacitors of the plurality of converters, so as to estimate the amount of the current supplied to the control circuit.

9. The power estimating apparatus according to claim 1, wherein the control circuit comprises a fixing device control circuit.

10. The power estimating apparatus according to claim 1, wherein the total amount of currents supplied to the control circuit and the at least one converter is a sum of the current supplied to the control circuit and the current supplied to the at least one converter.

11. The power estimating apparatus according to claim 1, wherein the estimating unit is configured to use the obtained total amount of currents to estimate the amount of the current supplied to the control circuit alone.

12. The power estimating apparatus according to claim 1, wherein the estimating unit is configured to use the obtained total amount of currents to estimate the amount of the current supplied to the control circuit and an amount of the current supplied to the at least one converter, using the detector, and without providing separate current detectors for each of the control circuit and the at least one converter.

13. The power estimating apparatus according to claim 1, wherein the total amount of currents equals a sum of current A and current B, wherein current A is current supplied to the control circuit, and wherein current B is current supplied to the at least one converter that is different from current A.

14. An image forming apparatus comprising:

a driving circuit configured to use an alternating-current power supply to drive a fixing device comprising a heater, the fixing device being configured to fix a formed image;

a converter that is connected to a branch point between the alternating-current power supply and the driving circuit, wherein the converter includes a smoothing capacitor, and wherein the converter is configured to convert an alternating current from the alternating-current power supply into a direct current;

a detector configured to obtain a total amount of currents supplied to the driving circuit and the converter; and at least one processor configured to implement an estimating unit configured to use the total amount of currents to estimate an amount of the current supplied to the driving unit, the total amount of currents being obtained by the detector in a charge and discharge period during which the smoothing capacitor performs a charge and discharge operation.

15. A power estimating apparatus comprising:
a control circuit configured to use an alternating-current power supply;
at least one converter that is connected to a branch point between the alternating-current power supply and the control circuit,
wherein the at least one converter is configured to convert an alternating current from the alternating-current power supply into a direct current;
a detector configured to obtain a total amount of currents supplied to the control circuit and the at least one converter; and
at least one processor configured to implement an estimating unit configured to estimate an amount of a current using the total amount of currents in at least one of a predetermined period before a zero cross and a predetermined period after the zero cross, the current being used when the control circuit operates, the zero cross being a zero cross of the total amount of currents obtained by the detector.

16. A non-transitory computer readable medium storing a program which, if executed, causes a computer to execute a process for power estimation, the process causing the computer to function as the estimating unit of the power estimating apparatus according to claim 1.

* * * * *